(12) United States Patent
Schweitzer et al.

(10) Patent No.: US 7,264,679 B2
(45) Date of Patent: Sep. 4, 2007

(54) CLEANING OF CHAMBER COMPONENTS

(75) Inventors: Marc O'Donnell Schweitzer, San Jose, CA (US); Jennifer Watia Tiller, Santa Clara, CA (US); Brian West, San Jose, CA (US); Karl Brueckner, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 172 days.

(21) Appl. No.: 10/777,866

(22) Filed: Feb. 11, 2004

(65) Prior Publication Data

US 2005/0172984 A1    Aug. 11, 2005

(51) Int. Cl.
*B08B 3/00* (2006.01)
*B08B 5/00* (2006.01)

(52) U.S. Cl. .................. 134/30; 134/19; 134/22.1; 134/26; 134/28; 134/34; 134/37

(58) Field of Classification Search ............ 134/1, 134/19, 22.1, 26, 28, 30, 34, 37
See application file for complete search history.

(56) References Cited

U.S. PATENT DOCUMENTS

| | | | | |
|---|---|---|---|---|
| 3,934,379 A | * | 1/1976 | Braton et al. | 451/38 |
| 4,627,197 A | * | 12/1986 | Klee et al. | 451/3 |
| 5,391,275 A | | 2/1995 | Mintz | |
| 5,401,319 A | | 3/1995 | Banholzer et al. | |
| 5,474,649 A | | 12/1995 | Kava et al. | |
| 5,555,902 A | | 9/1996 | Menon | |
| 5,908,510 A | | 6/1999 | McCullough et al. | |
| 5,910,338 A | | 6/1999 | Donde et al. | |
| 5,916,151 A | | 6/1999 | Richardson et al. | |
| 5,954,887 A | * | 9/1999 | Hatano | 134/2 |
| 6,082,373 A | * | 7/2000 | Sakurai et al. | 134/1 |
| 6,214,130 B1 | * | 4/2001 | Sasaki | 134/19 |
| 6,408,860 B1 | | 6/2002 | Chin et al. | |
| 2002/0086118 A1 | | 7/2002 | Chang et al. | |
| 2003/0173526 A1 | | 9/2003 | Popiolkowski et al. | |
| 2003/0188766 A1 | | 10/2003 | Banerjee et al. | |

(Continued)

FOREIGN PATENT DOCUMENTS

EP    0 633 433 A    1/1995

(Continued)

OTHER PUBLICATIONS

U.S. Patent Application title, "Fabricating and Cleaning Chamber Components Having Textured Surfaces," filed Sep. 2, 2003, U.S. Appl. No. 10/653,713; West et al.

*Primary Examiner*—Michael Barr
*Assistant Examiner*—Saeed Chaudhry
(74) *Attorney, Agent, or Firm*—Janah & Associates, P.C.

(57) ABSTRACT

In a method of cleaning a surface of a substrate processing chamber component to remove process deposits, the component surface is cooled to a temperature below about −40° C. to fracture the process deposits on the surface. The surface can be cooled by immersing the surface in a low temperature fluid, such as liquid nitrogen. In another version, the component surface is heated to fracture and delaminate the deposits, and optionally, subsequently rapidly cooled to form more fractures. The component surface cleaning can also be performed by bead blasting followed by a chemical cleaning step.

24 Claims, 2 Drawing Sheets

U.S. PATENT DOCUMENTS

2004/0056211 A1  3/2004  Popiolkowski et al.

FOREIGN PATENT DOCUMENTS

| JP | 57010370 | 1/1982 |
| JP | 63155729 | 6/1988 |
| JP | 02257613 | 10/1990 |
| JP | 03190131 | 8/1991 |
| JP | 07066119 | 3/1998 |
| JP | 2001-274135 | 10/2001 |
| WO | WO-03086668 A1 | 10/2003 |

* cited by examiner

CLEANING OF CHAMBER COMPONENTS

BACKGROUND

The present invention relates to the cleaning of process deposits from substrate processing chamber components.

In the processing of substrates, such as semiconductor wafers and displays, a substrate is placed in a process chamber and exposed to an energized gas to deposit or etch material on the substrate. During such processing, process residues are generated and deposited on internal surfaces in the chamber. For example, in sputter deposition processes, material sputtered from a target for deposition on a substrate also deposits on other component surfaces in the chamber, such as on deposition rings, shadow rings, wall liners, and focus rings. In subsequent process cycles, the deposited process residues can "flake off" of the chamber surfaces to fall upon and contaminate the substrate. Consequently, the deposited process residues must be periodically cleaned from the chamber surfaces.

However, it can be difficult to clean process deposits from components without excessively eroding the surface of the components. This can be especially true when cleaning process residues containing metals from components that are made of metal-containing materials. The metal-containing process deposits are difficult to remove because cleaning solutions suitable for their removal are also frequently reactive with other metals that are used to form chamber components. For example, a cleaning solution that is suitable for the removal of tantalum-containing process residues can also react with and erode chamber surfaces comprising titanium or aluminum. Thus, cleaning of metal-containing deposits from such surfaces can erode the components and require their frequent replacement.

The erosion of component surfaces can also be problematic when cleaning textured surfaces, such as surfaces formed by a "Lavacoat™" process. Such textured surfaces are desirable because they provide a "sticky" surface with crevices, depressions and protrusions to which process deposits adhere to reduce particle generation in the chamber. However, because the process deposits can get lodged in the pores and crevices of the surface, it is difficult to remove these deposits with conventional cleaning process. For example, cleaning the deposits with a conventional bead blasting process often results in the erosion of the protrusions of the textured surface, requiring frequent replacement and/or resurfacing of the component.

Thus, it is desirable to have a method of cleaning process deposits from surfaces of components without excessively eroding the surfaces. It is also desirable to have a method of selectively cleaning metal-containing process deposits from the metal surfaces of chamber components.

SUMMARY

In a method of cleaning a surface of a substrate processing chamber component to remove process deposits therefrom, the component surface is cooled to a temperature below about −40° C., thereby fracturing the process deposits on the surface. For example, the surface can be cooled by immersing the surface in a low temperature fluid, such as liquid nitrogen.

In another version of cleaning method, the surface is heated to a temperature of at least about 150° C., thereby loosening the process deposits. The process deposits can then be removed from the surface.

In yet another version of a cleaning method, the surface is immersed in a bath comprising liquid nitrogen to form fractures in the process deposits. The surface is then heated to a temperature of at least about 150° C. to expand the fractures. The heated surface is cooled by flowing a fluid over the surface to form further fractures. The fractured deposits are removed from the surface by at least one of (i) bead blasting the surface, and (ii) cleaning the surface with a cleaning solution.

DRAWINGS

These features, aspects, and advantages of the present invention will become better understood with regard to the following description, appended claims, and accompanying drawings, which illustrate examples of the invention. However, it is to be understood that each of the features can be used in the invention in general, not merely in the context of the particular drawings, and the invention includes any combination of these features, where:

DESCRIPTION

Figure 1:
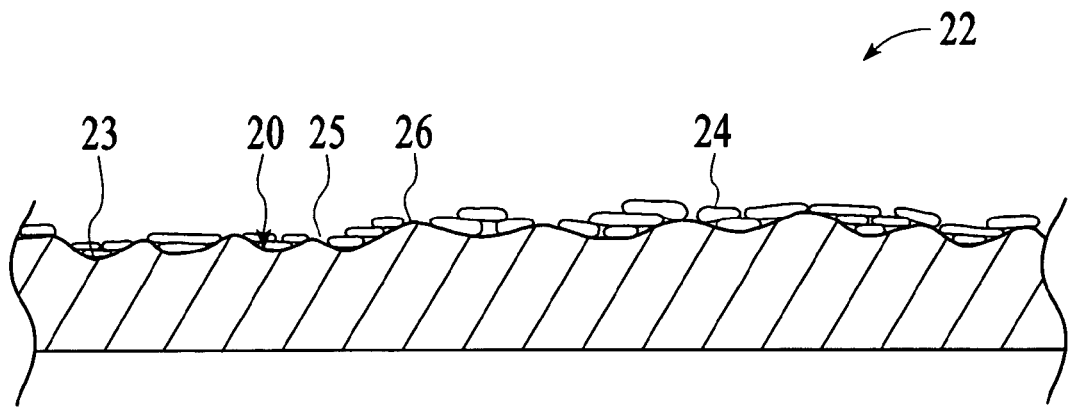
FIG. 1 is schematic side view of an embodiment of a substrate processing chamber component having a surface with process deposits thereon.

A process chamber component 22 having a surface 20 is cleaned to remove process deposits 24 that are generated during processing of a substrate 104, as shown for example in FIG. 1. Performing a cleaning process to remove the deposits 24 can reduce the formation of contaminant particles in the chamber 106 and improve substrate yields. The process deposits 24 can comprise metal-containing deposits, such as deposits comprising at least one of tantalum, tantalum nitride, titanium, titanium nitride, aluminum, copper, tungsten, and tungsten nitride. The chamber components 22 cleaned in the process comprise those that accumulate process deposits 24, such as for example, as shown in FIG. 3, a portion of a gas delivery system 112 that provides process gas in the chamber 106, a substrate support 114 that supports the substrate 104 in the chamber 106, a gas energizer 116 that energizes the process gas, chamber enclosure walls 118 and shields 120, or a gas exhaust 122 that exhausts gas from the chamber 106.

Figure 3:
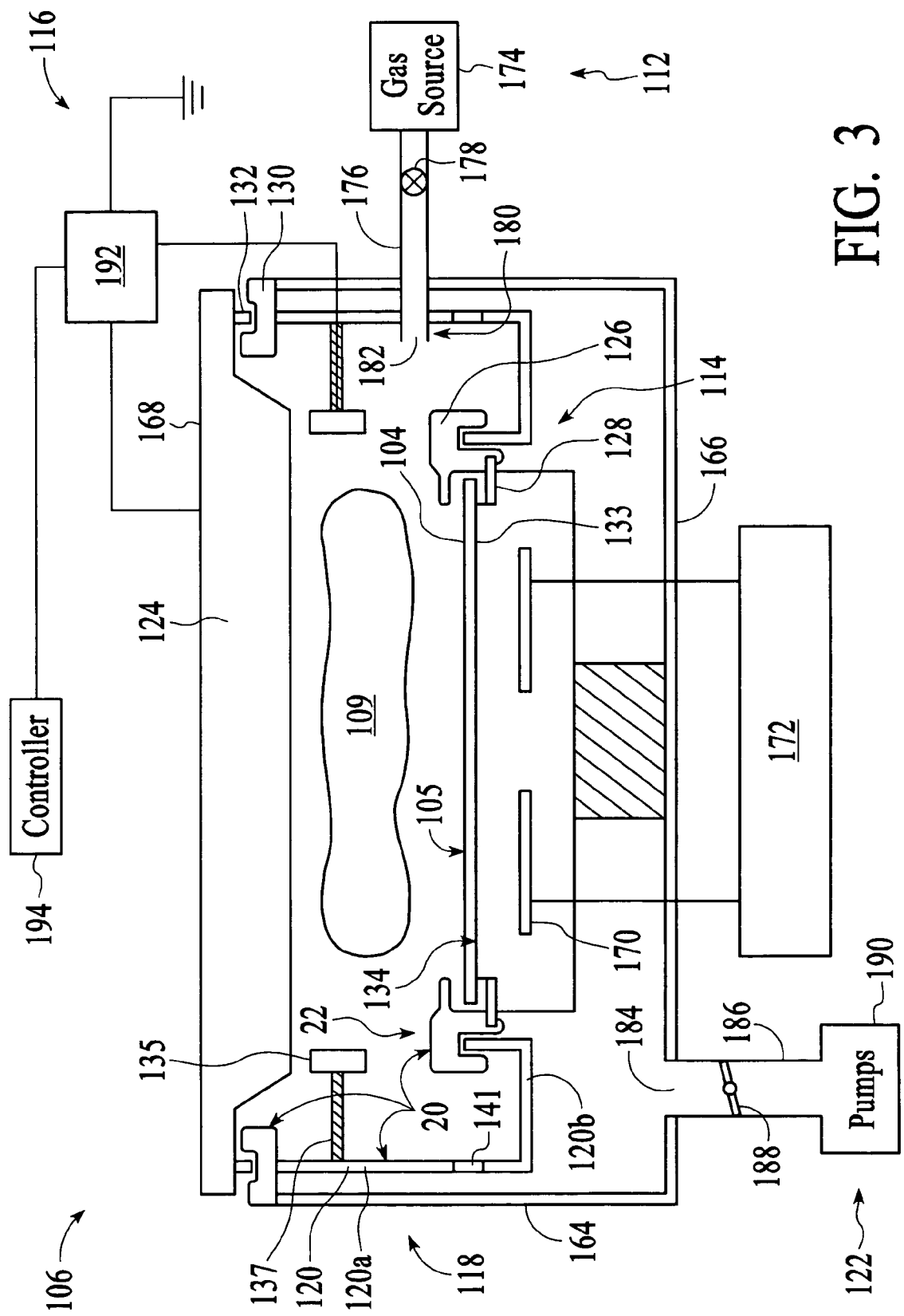
FIG. 3 is a sectional side view of an embodiment of a substrate processing chamber having one or more components that can be cleaned in a cleaning process.

Referring to FIG. 3, which illustrates an exemplary version of a physical vapor deposition chamber 106, components 22 that can be cleaned include a chamber enclosure wall 118, a chamber shield 120, a target 124, a cover ring 126, a deposition ring 128, a support ring 130, insulator ring 132, a coil 135, coil support 137, shutter disk 133, clamp shield 141, and a surface 134 of the substrate support 114. For example, components that can be cleaned can include Applied Material's part numbers 0020-50007, 0020-50008, 0020-50010, 0020-50012, 0020-50013, 0020-48908, 0021-23852, 0020-48998, 0020-52149, 0020-51483, 0020-49977, 0020-52151, 0020-48999, 0020-48042 and 0190-14818, from Applied Materials, Santa Clara, Calif. This list of components is merely exemplary and the cleaning process can be used on other components, or components from other types of chambers, thus, the present cleaning method should not be limited to use on the components listed or described herein. Typically, components 22 cleaned in the process have metal surfaces 20, such as surfaces 20 comprising at least one of titanium, stainless steel, copper, tantalum and aluminum; other components having other types of surfaces can also be cleaned, such as ceramic surfaces 20, including aluminum oxide, aluminum nitride, and quartz.

It has been discovered that improved cleaning of the process deposits 24 can be achieved by cooling the surface 20 of the component 22 to low temperatures. While cooling to low temperatures, the difference in the thermal expansion coefficients of the surface 20 and the process deposits 24 results in different rates of contraction of the surface 20 and deposits 24 to form cracks and fractures 25 in the process deposits 24. The fractured process deposits 24 are less strongly adhered to the surface 20, and can be more easily removed to clean the surface 20. A temperature that is suitably low to fracture the process deposits 24 is a temperature of less than about −40° C., and even less than about −196° C., such as a temperature of from about −65° C. to about −196° C. The low temperature removal method may be especially useful for surfaces 20 having a thermal expansion coefficient of at least about 2 times the thermal expansion coefficient of the process deposits 24.

In one version of a method of removing the process deposits 24, the surface 20 of the component 22 is cooled with a low temperature fluid. The fluid may comprise a liquefied gas, such as for example liquid nitrogen. Other suitable fluids can comprise, for example, ethanol or other liquid cooled by the addition of dry ice (solid $CO_2$).

The surface 20 can be cooled by immersing at least a portion of, and even substantially the entire surface 20 in the low temperature fluid. Immersing the surface 20 in a fluid can drop the temperature of the surface faster creating more thermal shock in the surface 20. This is desirable when the accumulated deposits are particularly hard to clean, for example, when they have less of a thermal expansion mismatch, or are better adhered to the surface 20 of a component 22.

The surface 20 can also be cooled by spraying the fluid across the surface 20, or otherwise flowing fluid over the component surface 20. While spraying or flowing fluid over the surface 20 is slower to cool the surface 20, it may be beneficial when the fluid has to be directed onto specific regions or portions of a component surface 20. For example, when the component 22 has surface regions with the deposits formed on them, and other regions without deposits or that are sensitive to and would be degraded by excessive thermal shock, these components 22 can be cooled at the localized regions using a spraying or flowing method.

In one embodiment, the surface 20 is cooled by immersing the surface 20 in a low temperature fluid bath comprising liquid nitrogen. Liquid nitrogen has a temperature that is suitably low to fracture and break away the process deposits 24, the temperature of the liquid nitrogen typically being about −196° C. The low temperature bath of liquid nitrogen is also advantageous because liquid nitrogen is substantially non-reactive with the materials used to fabricate chamber components 22. The surface 20 can be immersed in the liquid nitrogen until the liquid nitrogen bath stops bubbling, indicating that the surface 20 has reached a temperature that is substantially close to that of the liquid nitrogen. A suitable immersion time duration may be from about 1 to about 5 minutes.

In one version, the process deposit removal is enhanced by ultrasonically agitating the surface 20 while the surface 20 is immersed in the liquid nitrogen bath, for example by introducing sound waves to the surface 20 to lightly shake the surface 20. Ultrasonic waves can be generated by, for example, mounting an ultrasonic transducer on the component 22, or mounting the transducer on a portion of a low temperature fluid bath containment vessel. The ultrasonic agitation further loosens residues that were already partially loosened or detached, and can also break up residues that were partially delaminated but still adhering to the surface 20.

In one version, a pre-cooling step can be performed to pre-cool the surface 20 before immersing the surface in liquid nitrogen. The pre-cooling step brings the temperature of the surface 20 closer to that of the liquid nitrogen, which reduces the amount of liquid nitrogen required to cool the surface 20, and can lower the overall cooling costs. The pre-cooling step desirably cools the surface 20 to a temperature of from about −40° C. to about −65° C. In one version, the pre-cooling step is performed by placing the component 22 in a refrigerated chamber, such as an industrial refrigerator capable of cooling the surface 20 to the desired pre-cooling temperature. Alternatively, the step of cooling the surface 20 in a refrigerated chamber may sufficiently fracture the process deposits 24 such that the refrigeration step can be performed in the place of the liquid nitrogen immersion step.

Once the process deposits 24 have been fractured by cooling the component surface 20, one or more subsequent process deposit removal steps can be performed to remove the fractured deposits. In one version, the fractured process deposits 24 are at least partially removed by grit and/or bead blasting the surface 20. In the grit blasting process, a stream of hard grit particles is propelled toward the surface 20 by gas that is pressurized to a pressure sufficiently high to remove the fractured process deposits from the surface 20. For example, a suitable pressure may be from about 103 kPa (15 PSI) to about 552 kPa (80 PSI.) The grit particles may comprise a mesh size of from about 16 to about 150, corresponding to a particle size of from about 1092 micrometers to about 89 micrometers. In another version, a flow of pressurized gas is directed against the surface 20 to remove the process deposits 24, such as a pressurized flow of $CO_2$.

In one version, the fractured process deposits 24 are removed by cleaning the surface 20 with a chemical cleaning solution. The cleaning solution can penetrate the fractures 25 formed in the process deposits 24 to loosen and clean the deposits 24 from the surface 20. The cleaning solution can comprise an acidic or basic solution that chemically etches the process deposits 24. For example, a suitable cleaning solution can comprise a solution of HF in a concentration of from about 2.5% to about 17% by weight, and $HNO_3$ in a concentration of from about 23% to about 67% by weight, with the balance being water. The surface 20 can be cleaned by immersing the surface 20 in the cleaning solution, as well as by spraying or rinsing the surface 20 with the cleaning solution. The surface 20 can also be ultrasonically agitated during cleaning with the cleaning solution. Other cleaning steps can also be performed to remove the fractured process deposits, such as de-ionized water rinses, and further ultrasonic cleaning steps.

It has been further discovered that residue removal results can be improved by heating the surface 20 of the component 22 to a suitably high temperature. For example, the surface 20 can be heated after the initial process residue fracturing step. It is believed that heating of the surface 20 takes advantage of the differences in the thermal expansion coefficients of the surface 20 and deposits 24 to expand the fractures 25 formed in the process deposits 24. The further fractured deposits 24 are more detached and delaminated from the surface, and thus can be more easily removed. A suitably high temperature may be a temperature of at least about 150° C. and even at least about 300° C., such as from about 300° C. to about 350° C., and may even be as high as about 400° C. For example, for a surface 20 comprising at least one of copper, titanium, stainless steel and tantalum, a suitable high temperature may be at least about 500° C., and may even be as high as at least about 600° C. Heating the surface 20 desirably induces stress in the deposited material substantially without damaging the component 22. Thus, in one version, the temperature may not exceed more than 75% of the melting temperature of the component surface 20, to maintain the integrity of the component structure. For example, for a surface 20 comprising aluminum, a suitable high temperature may be at least about 200° C., such as at least about 300° C., and less than about 500° C., such as less than about 480° C. The surface 20 can be heated by, for example, placing the component 22 in a heating furnace, radiantly heating the surface with heating lamps, radiantly heating the surface with quartz heating tubes, or by passing a heated gas across the surface 20. In one version, the surface 20 is heated to a sufficiently high temperature before a low temperature cooling step is been performed. In another version, the heating step may provide sufficient fracturing of the process residues such that other temperature treatment steps, such as the low temperature cooling step, are not required.

In one version, the heated surface 20 can be further treated to remove the process deposits 24 by performing a "shock cooling" step to rapidly cool the surface 20. In the shock cooling step, the heated surface 20 is rapidly cooled by exposing the surface 20 to a cool fluid, such as water. The shock cooling step rapidly cools the heated surface 20 by at least about 50° C. per second, thereby further fracturing and loosening the deposits 24 from the surface 20. For example, the shock cooling step may cool the surface 20 from a temperature of at least about 150° C. to a temperature of less than about 40° C., and even less than about 20° C., such as from a temperature of about 350° C. to a temperature of about 20° C. The surface 20 can be exposed to the cool fluid by flowing the fluid over the surface 20, for example by immersing the surface 20 in the fluid. It may also be desirable to cool the process deposits 24 while keeping the rest of the component 22 at a relatively warm temperature, to increase the difference in the thermal contraction rates of the process deposits 24 and component surface 20. For example, the process deposits 24 may be cooled by spraying or rinsing the deposits 24 on the surface 20 with the fluid, while the bulk of the component 22 remains at a relatively warm temperature. A cool fluid suitable for the shock cooling step may be water having a temperature of from about 10° C. to about 25° C.

One or more of a grit blasting step and a chemical solution cleaning step, such as those described above, can be performed before or after shock cooling the surface 20 to further remove the process deposits. In a preferred version, a grit blasting step is performed after shock cooling the surface 20 and before cleaning the surface 20 with a cleaning solution.

Figure 2:
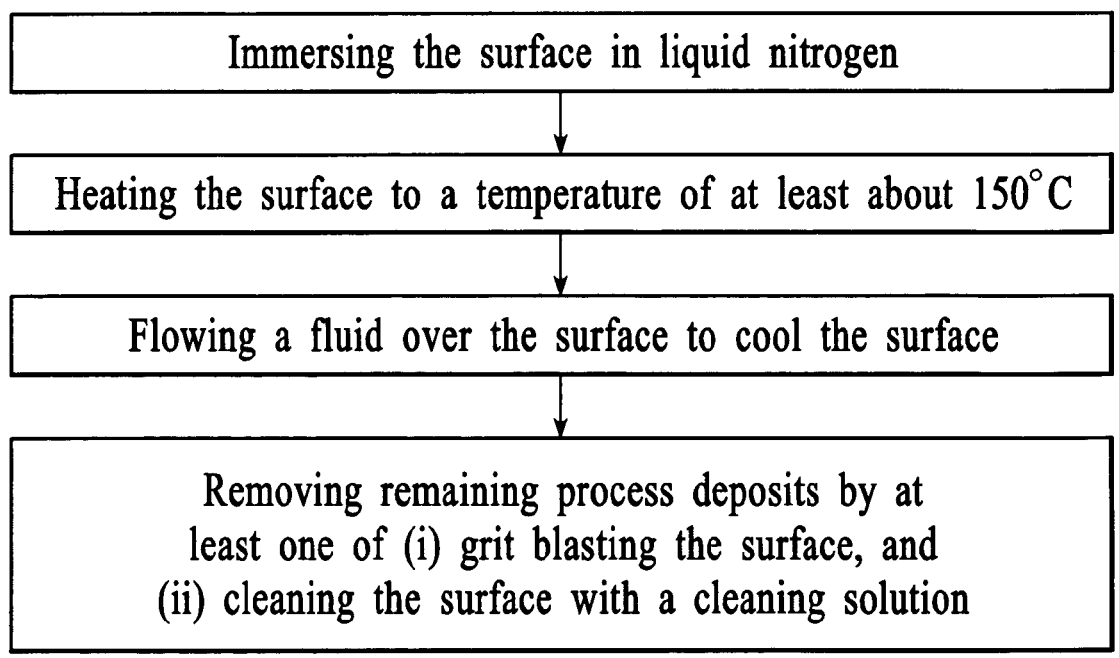
FIG. 2 is a flow chart showing an embodiment of a method of cleaning process deposits from the surface of a substrate processing chamber component.

FIG. 2 is a flow chart illustrating an embodiment of a method of cleaning process deposits 24 from the surface of a process chamber component 22. In the first step of this embodiment, the surface 20 is immersed in liquid nitrogen to fracture the process deposits. The surface is then heated to a temperature of at least about 150° C. to expand the fractures. The heated surface is cooled by flowing a fluid over the surface 20. Remaining process residues 24 are then removed from the surface 20 by at least one of (i) grit blasting the surface 20, and (ii) cleaning the surface with a cleaning solution. The cleaning process is capable of cleaning the process components 22 to provide component surfaces 20 that are substantially absent process deposits.

The cleaning methods described are particularly suitable to clean component surfaces 20 that are textured, as shown for example in FIG. 1. Components 22 having textured surfaces reduce particle generation in the process chamber by providing a "sticky" surface to which process deposits 24 adhere. In one version, the process chamber components 22 comprise surfaces textured by a "Lavacoat™" process, such as for example components described in U.S. patent application Ser. No. 10/653,713 to West, et al, filed on Sep. 2, 2003, entitled "Fabricating and Cleaning Chamber Components Having Textured Surfaces," U.S. patent application Ser. No. 10/099,307, filed Mar. 13, 2002, to Popiolkowski et al, and U.S. patent application Ser. No. 10/622,178, filed on Jul. 17, 2003 to Popiolkowski et al., all commonly assigned to Applied Materials, Inc., and all of which are incorporated herein by reference in their entireties.

The Lavacoat™ textured surface 20 can be formed by generating an electromagnetic energy beam and directing the beam onto the surface 20 of the component 22. The electromagnetic energy beam is preferably an electron beam, but can also comprise protons, neutrons and X-rays and the like. The electron beam is typically focused on a region of the surface 20 for a period of time, during which time the beam interacts with the surface 20 to form features on the surface. It is believed that the beam forms the features by rapidly heating the region of the surface 20, in some cases to a melting temperature of the surface material. The rapid heating causes some of the surface material to be ejected outwards, which forms depressions 23 in the regions the material was ejected from, and protuberances 26 in areas where the ejected material re-deposits. After the desired features in the region are formed, the beam is scanned to a different region of the component surface 20 to form features in the new region. The final surface 20 can comprise a honeycomb-like structure of depressions 23 and protuberances 26 formed in the surface 20. The features formed by this method are typically macroscopically sized, and the depressions can range in diameter from about 0.1 mm to about 3.5 mm, such as from about 0.8 to about 1.0 mm in diameter. The Lavacoat™ textured surface 20 has an overall surface roughness average of from about 2500 microinches (63.5 micrometers) to about 4000 microinches (101.6 micrometers), the roughness average of the surface 20 being defined as the mean of the absolute values of the displacements from the mean line of the features along the surface 20.

An example of a suitable process chamber 106 having a component 22 that is cleaned to remove process deposits 24 is shown in FIG. 3. The chamber 106 can be a part of a multi-chamber platform (not shown) having a cluster of interconnected chambers connected by a robot arm mechanism that transfers substrates 104 between the chambers 106. In the version shown, the process chamber 106 comprises a sputter deposition chamber, also called a physical vapor deposition or PVD chamber, that is capable of sputter depositing material on a substrate 104, such as one or more of tantalum, tantalum nitride, titanium, titanium nitride, copper, tungsten, tungsten nitride and aluminum. The chamber 106 comprises enclosure walls 118 that enclose a process zone 109, and that include sidewalls 164, a bottom wall 166, and a ceiling 168. A support ring 130 can be arranged between the sidewalls 164 and ceiling 168 to support the ceiling 168. Other chamber walls can include one or more shields 120 that shield the enclosure walls 118 from the sputtering environment.

The chamber 106 comprises a substrate support 114 to support the substrate in the sputter deposition chamber 106. The substrate support 114 may be electrically floating or may comprise an electrode 170 that is biased by a power supply 172, such as an RF power supply. The substrate support 130 can also comprise a moveable shutter disk 133 that can protect the upper surface 134 of the support 130 when the substrate 104 is not present. In operation, the substrate 104 is introduced into the chamber 106 through a substrate loading inlet (not shown) in a sidewall 164 of the chamber 106 and placed on the support 114. The support 114 can be lifted or lowered by support lift bellows and a lift finger assembly (not shown) can be used to lift and lower the substrate onto the support 114 during transport of the substrate 104 into and out of the chamber 106.

The support 114 may also comprise one or more rings, such as a cover ring 126 and a deposition ring 128, that cover at least a portion of the upper surface 134 of the support 114 to inhibit erosion of the support 130. In one version, the deposition ring 128 at least partially surrounds the substrate 104 to protect portions of the support 114 not covered by the substrate 104. The cover ring 126 encircles and covers at least a portion of the deposition ring 128, and reduces the deposition of particles onto both the deposition ring 128 and the underlying support 114.

A process gas, such as a sputtering gas, is introduced into the chamber 106 through a gas delivery system 112 that includes a process gas supply comprising one or more gas sources 174 that each feed a conduit 176 having a gas flow control valve 178, such as a mass flow controller, to pass a set flow rate of the gas therethrough. The conduits 176 can feed the gases to a mixing manifold (not shown) in which the gases are mixed to from a desired process gas composition. The mixing manifold feeds a gas distributor 180 having one or more gas outlets 182 in the chamber 106. The process gas may comprise a non-reactive gas, such as argon or xenon, which is capable of energetically impinging upon and sputtering material from a target. The process gas may also comprise a reactive gas, such as one or more of an oxygen-containing gas and a nitrogen-containing gas, that are capable of reacting with the sputtered material to form a layer on the substrate 104. Spent process gas and byproducts are exhausted from the chamber 106 through an exhaust 122 which includes one or more exhaust ports 184 that receive spent process gas and pass the spent gas to an exhaust conduit 186 in which there is a throttle valve 188 to control the pressure of the gas in the chamber 106. The exhaust conduit 186 feeds one or more exhaust pumps 190. Typically, the pressure of the sputtering gas in the chamber 106 is set to sub-atmospheric levels.

The sputtering chamber 106 further comprises a sputtering target 124 facing a surface 105 of the substrate 104, and comprising material to be sputtered onto the substrate 104, such as for example at least one of tantalum and tantalum nitride. The target 124 is electrically isolated from the chamber 106 by an annular insulator ring 132, and is connected to a power supply 192. The sputtering chamber 106 also has a shield 120 to protect a wall 118 of the chamber 106 from sputtered material. The shield 120 can comprise a wall-like cylindrical shape having upper and lower shield sections 120a, 120b that shield the upper and lower regions of the chamber 106. In the version shown in FIG. 3, the shield 120 has an upper section 120a mounted to the support ring 130 and a lower section 120b that is fitted to the cover ring 126. A clamp shield 141 comprising a clamping ring can also be provided to clamp the upper and lower shield sections 120a,b together. Alternative shield configurations, such as inner and outer shields, can also be provided. In one version, one or more of the power supply 192, target 124, and shield 120, operate as a gas energizer 116 that is capable of energizing the sputtering gas to sputter material from the target 124. The power supply 192 applies a bias voltage to the target 124 with respect to the shield 120. The electric field generated in the chamber 106 from the applied voltage energizes the sputtering gas to form a plasma that energetically impinges upon and bombards the target 124 to sputter material off the target 124 and onto the substrate 104. The support 114 having the electrode 170 and support electrode power supply 172 may also operate as part of the gas energizer 116 by energizing and accelerating ionized material sputtered from the target 124 towards the substrate 104. Furthermore, a gas energizing coil 135 can be provided that is powered by a power supply 192 and that is positioned within the chamber 106 to provide enhanced energized gas characteristics, such as improved energized gas density. The gas energizing coil 135 can be supported by a coil support 137 that is attached to a shield 120 or other wall in the chamber 106.

The chamber 106 is controlled by a controller 194 that comprises program code having instruction sets to operate components of the chamber 106 to process substrates 104 in the chamber 106. For example, the controller 194 can comprise a substrate positioning instruction set to operate one or more of the substrate support 114 and substrate transport to position a substrate 104 in the chamber 106; a gas flow control instruction set to operate the flow control valves 178 to set a flow of sputtering gas to the chamber 106; a gas pressure control instruction set to operate the exhaust throttle valve 188 to maintain a pressure in the chamber 106; a gas energizer control instruction set to operate the gas energizer 116 to set a gas energizing power level; a temperature control instruction set to control temperatures in the chamber 106; and a process monitoring instruction set to monitor the process in the chamber 106.

Although exemplary embodiments of the present invention are shown and described, those of ordinary skill in the art may devise other embodiments which incorporate the present invention, and which are also within the scope of the present invention. For example, other chamber components than the exemplary components described herein can also be cleaned. Additional cleaning steps other than those described could also be performed, and the cleaning steps could be performed in an order other than that described. Furthermore, relative or positional terms shown with respect to the exemplary embodiments are interchangeable. Therefore, the appended claims should not be limited to the descriptions of the preferred versions, materials, or spatial arrangements described herein to illustrate the invention.

What is claimed is:

1. A method of cleaning a surface of a substrate processing chamber component to remove process deposits therefrom, the method comprising sequentially the steps of:
    (a) heating the surface comprising the process deposits to a temperature of at least about 150° C.; and then rapidly
    (b) cooling the surface comprising the process deposits to a temperature below about −40° C. by at least one of (i) immersing the surface in liquid nitrogen, and (ii) spraying the surface with the liquid nitrogen, thereby fracturing the process deposits on the surface.

2. A method according to claim 1 wherein the surface comprises a first thermal expansion coefficient and the process deposits comprise a second thermal expansion coefficient, and wherein the first thermal expansion coefficient is at least 2 times the second thermal expansion coefficient.

3. A method according to claim 1 wherein (b)(i) further comprises ultrasonically agitating the surface.

4. A method according to claim 1 further comprising at least one of:
(c) grit blasting the surface; or
(d) cleaning the surface with a cleaning solution comprising HF and $HNO_3$.

5. A method according to claim 1 further comprising heating the surface to a temperature of at least about 300° C.

6. A method according to claim 5 further comprising, after heating the surface, flowing a cool fluid over the surface.

7. A method according to claim 1 wherein the surface comprises a textured surface.

8. A method according to claim 1 wherein the surface comprises at least one of titanium, stainless steel, copper, tantalum and aluminum, and the process deposits comprise at least one of tantalum, tantalum nitride, titanium, titanium nitride, copper, aluminum, tungsten and tungsten nitride.

9. A method according to claim 1 further comprising heating the surface to a temperature of from about 300° C. to about 350° C.

10. A method according to claim 1 wherein the surface comprises at least one of copper, titanium, stainless steel and tantalum, and wherein the method comprises heating the surface to a temperature of at least about 500° C.

11. A method according to claim 1 comprising heating the surface to a temperature that does not exceed more than 75% of the melting temperature of the component surface.

12. A method according to claim 1 further comprising heating the surface by placing the component in a heating furnace.

13. A method according to claim 1 comprising cooling the surface at a rate of at least about 50° C. per second.

14. A method according to claim 1 further comprising cooling the process deposits on the surface while maintaining the rest of the component at a relatively warmer temperature to increase the difference in the thermal contraction rates of the process deposits and component surface.

15. A method according to claim 1 comprising cooling the surface by spraying or rinsing the process deposits on the surface with the liquid nitrogen while maintaining the bulk of the component at a relatively warmer temperature.

16. A method of cleaning a surface of a substrate processing chamber component to remove process deposits therefrom, the method comprising sequentially the steps of:
(a) heating the surface comprising the process deposits to a temperature of at least about 150° C.; and then
(b) cooling the surface comprising the process deposits at a cooling rate of at least about 50° C. per second to a temperature below about −40° C. by (i) immersing the surface in liquid nitrogen, or (ii) spraying the surface with the liquid nitrogen, thereby fracturing the process deposits on the surface.

17. A method according to claim 16 wherein the surface comprises a first thermal expansion coefficient and the process deposits comprise a second thermal expansion coefficient, and wherein the first thermal expansion coefficient is at least 2 times the second thermal expansion coefficient.

18. A method according to claim 16 wherein (b) (i) further comprises ultrasonically agitating the surface.

19. A method according to claim 16 further comprising at least one of:
(b) grit blasting the surface; or
(c) cleaning the surface with a cleaning solution comprising HF and $HNO_3$.

20. A method according to claim 16 further comprising heating the surface to a temperature of at least about 300° C.

21. A method according to claim 16 wherein the surface comprises at least one of copper, titanium, stainless steel and tantalum, and wherein the method comprises heating the surface to a temperature of at least about 500° C.

22. A method according to claim 16 comprising heating the surface to a temperature that does not exceed more than 75% of the melting temperature of the component surface.

23. A method according to claim 16 further comprising cooling the process deposits on the surface while maintaining the rest of the component at a relatively warmer temperature to increase the difference in the thermal contraction rates of the process deposits and component surface.

24. A method according to claim 16 comprising cooling the surface by spraying or rinsing the process deposits on The surface with the liquid nitrogen while maintaining the bulk of the component at a relatively warmer temperature.

* * * * *